(12) United States Patent
Murakami et al.

(10) Patent No.: US 11,069,788 B2
(45) Date of Patent: Jul. 20, 2021

(54) SEMICONDUCTOR DEVICE

(71) Applicant: TOYODA GOSEI CO., LTD., Kiyosu (JP)

(72) Inventors: Noriaki Murakami, Kiyosu (JP); Toru Oka, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 16/802,338

(22) Filed: Feb. 26, 2020

(65) Prior Publication Data
US 2020/0287012 A1 Sep. 10, 2020

(30) Foreign Application Priority Data
Mar. 6, 2019 (JP) .............................. JP2019-040879

(51) Int. Cl.
*H01L 29/45* (2006.01)
*H01L 29/47* (2006.01)
*H01L 29/20* (2006.01)
*H01L 29/78* (2006.01)

(52) U.S. Cl.
CPC ........ *H01L 29/452* (2013.01); *H01L 29/2003* (2013.01); *H01L 29/475* (2013.01); *H01L 29/7827* (2013.01)

(58) Field of Classification Search
CPC . H01L 29/452; H01L 29/475; H01L 29/2003; H01L 29/7827; H01L 29/872; H01L 29/66734; H01L 29/401; H01L 29/045; H01L 29/34; H01L 29/0878; H01L 29/41741; H01L 29/41766; H01L 29/7813
See application file for complete search history.

(56) References Cited

U.S. PATENT DOCUMENTS

2014/0353832 A1* 12/2014 Murakami ............ H01L 21/244
257/762
2018/0277375 A1 9/2018 Yasunishi

FOREIGN PATENT DOCUMENTS

JP 2015-008264 A 1/2015
JP 2018-163933 A 10/2018

* cited by examiner

*Primary Examiner* — Mohammed R Alam
(74) *Attorney, Agent, or Firm* — McGinn IP Law Group, PLLC

(57) ABSTRACT

To provide a semiconductor device including an electrode having a low contact resistance with the back surface of a GaN substrate and being suitably bonded with solder, and having a low electric resistance of the current flowing in a vertical direction. The semiconductor device has a GaN substrate, a first semiconductor layer, a second semiconductor layer, a third semiconductor layer, a fourth semiconductor layer, a body electrode, a drain electrode, a source electrode, and a gate electrode. The drain electrode has a Ti layer, an Al layer, a Ti layer, a TiN layer, a Ti layer, a Ni layer, and an Ag layer sequentially from the second surface of the GaN substrate.

13 Claims, 3 Drawing Sheets

SEMICONDUCTOR DEVICE

BACKGROUND OF THE INVENTION

Field of the Invention

The present invention relate to a semiconductor device.

Background Art

Group III nitride semiconductor represented by GaN has high dielectric breakdown field and high melting point. Therefore, Group III nitride semiconductor is expected as a material for high-output, high-frequency, and high-temperature semiconductor device instead of GaAs-based semiconductor. As an example, a HEMT device using Group III nitride semiconductor has been researched and developed.

Techniques for forming an electrode on Group III nitride semiconductor have been developed. For example, Japanese Patent Application Laid-Open (kokai) No. 2015-008264 discloses the techniques for forming an electrode on a semiconductor layer. It also discloses a structure in which TiN, Al, TiN, Ti, and Ag are sequentially deposited on a substrate (refer to FIG. 8). Moreover, in the performance evaluation, metal layers are formed on a sapphire substrate or a silicon substrate (for example paragraphs [0054]-[0061], and [0070]-[0072]).

A vertical semiconductor device is usually mounted on a substrate by soldering. In recent years, in consideration of influence to a human body and environment, lead-free solder is beginning to be used. Therefore, the electrode is required to have high bondability with lead-free solder. However, the surface layer of the electrode is alloyed with lead-free solder in solder bonding, and the electrode may not be sufficiently bonded with solder. Therefore, a technique of bonding the substrate and the lead frame using Ag nano paste is employed. When solder bonding is employed, poor bondability between the electrode and solder may reduce the current flowing in a vertical direction of the semiconductor device, and further may deteriorate durability of the semiconductor device.

In a GaN-based vertical semiconductor device, an n-type GaN substrate may be used as a conductive substrate. The back surface of the GaN substrate is usually a –c plane. It is not necessarily easy to bond the GaN substrate and the electrode so that the contact resistance between the –c plane of the GaN substrate and the electrode is small. When the contact resistance between the –c plane of GaN and the metal is high, the current flowing in a vertical direction of the semiconductor device is reduced.

The vertical semiconductor device may be used under a high temperature environment. In that case, metal in the electrode is sometimes diffused toward the GaN substrate. This may lead to an adverse effect on the GaN substrate. For example, when the contact resistance between the –c plane of the GaN substrate and the electrode is increased, the current flowing in a vertical direction of the semiconductor device is reduced.

SUMMARY OF THE INVENTION

An object of the present invention is to provide a semiconductor device including an electrode having a low contact resistance to GaN and being suitably bonded with solder, and having a low electric resistance of the current flowing in a vertical direction.

In a first aspect of the present invention, there is provided a semiconductor device. The semiconductor device comprises a GaN base layer having a first surface and a second surface; a Group III nitride semiconductor layer on the first surface of the GaN base layer; and an electrode on the second surface of the GaN base layer, wherein the first surface is a +c plane; the second surface is a surface opposite to the first surface; and the electrode has a first Ti layer, an Al-containing layer, a second Ti layer, a TiN layer, a third Ti layer, a Ni layer, and an Ag-containing layer sequentially from the second surface.

In the first aspect of the invention, the thickness of the TiN layer is preferably 500 nm to 6,000 nm, more preferably 1,000 nm to 5,000 nm. The semiconductor device may comprise a supporting substrate for supporting the semiconductor device, and a current supply member disposed on the supporting substrate, for supplying a current to the semiconductor device. The Ag-containing layer may be connected with the current supply member by a lead-free solder. The lead-free solder is preferably a Sn—Ni—Cu based solder. The second surface of the GaN base layer may have a concave-convex shape with any shape. The Al-containing layer is preferably an AlSi layer. The thickness of the first Ti layer is preferably 10 nm to 50 nm, the thickness of the AlSi layer is preferably 100 nm to 500 nm, the thickness of the second Ti layer is preferably 10 nm to 50 nm, the thickness of the third Ti layer is preferably 10 nm to 50 nm, the thickness of the Ni layer is preferably 200 nm to 1,000 nm, and the thickness of the Ag-containing layer is preferably 500 nm to 4,000 nm. The semiconductor device may be a trench gate vertical field effect transistor and the electrode may be a drain electrode. Also the semiconductor device may be a diode. The trench gate vertical field effect transistor may comprise an n-type GaN substrate as the GaN base layer, an n$^-$-type GaN layer formed on the n-type GaN substrate, electron concentration of the n$^-$-type GaN layer being smaller than electron concentration of the n-type GaN substrate, a p-type GaN layer formed on the n$^-$-type GaN layer, a p$^-$-type GaN layer formed on the p-type GaN layer, hole concentration of the p$^-$-type GaN layer being smaller than hole concentration of the p-type GaN layer, an n$^+$-type GaN layer formed on the p$^-$-type GaN layer. And also the trench gate vertical field effect transistor may comprise a trench penetrated from the n$^+$-type GaN layer to an upper part of the n$^-$-type GaN layer, an isolation film covering an inner surface of the trench, a gate electrode formed on the isolation film, a source electrode contacted with the n$^+$-type GaN layer, and a body electrode contacted with at least one of the p-type GaN layer and the p$^-$-type GaN layer.

In the semiconductor device, the back surface of the GaN base layer or the GaN substrate is in good contact with the electrode. Therefore, a current easily flows in a vertical direction of the semiconductor device. The aspect of the present invention, disclosed in the specification, provide a semiconductor device including an electrode having a low contact resistance with the surface of a GaN and being suitably bonded with solder, and having a low electric resistance of the current flowing in a vertical direction.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENT

Specific embodiments will next be described by taking, as examples, a semiconductor device. However, the present techniques are not limited to these embodiments.

First Embodiment

1. Semiconductor Device

Figure 1:
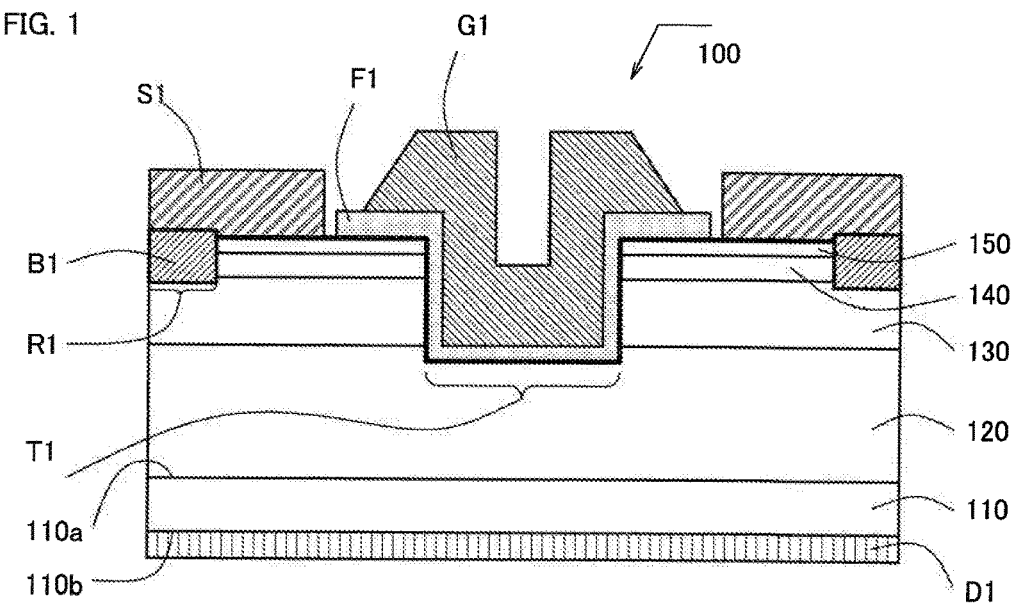
FIG. 1 is a schematic view of the structure of a semiconductor device of a first embodiment.

FIG. 1 is a schematic view of the structure of a semiconductor device 100 of a first embodiment. The semiconductor device 100 is a trench gate vertical MOSFET. The channel is n-channel whose conduction carriers are electrons and the MOSFET is normally off type, i.e., enhancement mode type. As shown in FIG. 1, the semiconductor device 100 includes a GaN substrate (i.e., GaN base layer) 110, a first semiconductor layer 120, a second semiconductor layer 130, a third semiconductor layer 140, a fourth semiconductor layer 150, a body electrode B1, a drain electrode D1, a source electrode S1, a gate electrode G1, and a gate insulating film F1.

The GaN substrate 110 is a substrate made of n-type GaN. The GaN substrate 110 has a first surface 110a and a second surface 110b. The first surface 110a and the second surface 110b are positioned opposite to each other. The first surface 110a is a surface for forming a semiconductor layer. The second surface 110b is a surface for forming a drain electrode D1. For example, the first surface 110a is a +c plane, and the second surface 110b is a −c plane.

The first semiconductor layer 120 is formed on the first surface 110a of the GaN substrate 110. The first semiconductor layer 120 is a first conduction type Group III nitride semiconductor layer. The first semiconductor layer 120 is made of, for example, n⁻-GaN. The thickness of the first semiconductor layer 120 is, for example, 5 µm to 20 µm. Here, the first conduction type indicates n-type, and the second conduction type indicates p-type. The impurity concentration of the first semiconductor layer 120 is, for example, $5\times10^{15}$ cm$^{-3}$ to $2\times10^{16}$ cm$^{-3}$. Si is used as n-conduction type impurity in the present embodiment.

The second semiconductor layer 130 is formed on the first semiconductor layer 120. The second semiconductor layer 130 is a second conduction type Group III nitride semiconductor layer. The second semiconductor layer 130 is made of, for example, p-GaN. The thickness of the second semiconductor layer 130 is, for example, 0.5 µm to 1.5 µm. The impurity concentration of the second semiconductor layer 130 is, for example, $6\times10^{17}$ cm$^{-3}$ to $2\times10^{18}$ cm$^{-3}$. Mg is used as p-conduction type impurity in the present embodiment.

The third semiconductor layer 140 is formed on the second semiconductor layer 130. The third semiconductor layer 140 is a second conduction type Group III nitride semiconductor layer. The third semiconductor layer 140 is made of, for example, p⁻-GaN. As described later, the carrier concentration of the third semiconductor layer 140 is lower than the carrier concentration of the second semiconductor layer 130. The thickness of the third semiconductor layer 140 is, for example, 0.01 µm to 0.5 µm. The impurity concentration of the third semiconductor layer 140 is, for example, $5\times10^{16}$ cm$^{-3}$ to $2\times10^{17}$ cm$^{-3}$. The impurity concentration is uniform in the entire area of the second semiconductor layer 130 and the third semiconductor layer 140, respectively. Also Si does not exist in the third semiconductor layer 140 in the present embodiment. These impurities are uniformly doped in the respective layers by impurity metal organic gas while the respective layers are growing.

The fourth semiconductor layer 150 is formed on the third semiconductor layer 140. The fourth semiconductor layer 150 is a first conduction type Group III nitride semiconductor layer. The fourth semiconductor layer 150 is made of, for example, n⁺-GaN. The thickness of the fourth semiconductor layer 150 is, for example, 0.1 µm to 0.6 µm. The impurity concentration of the fourth semiconductor layer 150 is, for example, $2\times10^{18}$ cm$^{-3}$ to $4\times10^{18}$ cm$^{-3}$.

The drain electrode D1 is a first electrode formed on the second surface 110b of the GaN substrate 110. As described above, the second surface 110b is, for example, a −c plane.

The body electrode B1 is a second electrode for extracting holes from the second semiconductor layer 130 and the third semiconductor layer 140. The body electrode B1 is formed in a recess R1. The recess R1 is a recessed part passing through the fourth semiconductor layer 150 and the third semiconductor layer 140, and reaching the middle of the second semiconductor layer 130. The body electrode B1 is in contact with the second semiconductor layer 130, the third semiconductor layer 140, the fourth semiconductor layer 150, and the source electrode S1.

The source electrode S1 is a third electrode formed on the fourth semiconductor layer 150 and the body electrode B1. The source electrode S1 is in contact with the fourth semiconductor layer 150. Therefore, the source electrode S1 can inject electrons into the fourth semiconductor layer 150. The source electrode S1 is in contact with the body electrode B1. Therefore, the source electrode S1 and the body electrode B1 are equipotential.

The gate electrode G1 is a fourth electrode formed at a trench T1 via the gate insulating film F1. The trench T1 is a recessed part passing through the fourth semiconductor layer 150, the third semiconductor layer 140, and the second semiconductor layer 130, and reaching the middle of the first semiconductor layer 120. The gate electrode G1 extends toward the source electrode S1.

The gate insulating film F1 covers the trench T1. That is, the gate insulating film F1 covers the side surfaces of the fourth semiconductor layer 150, the third semiconductor layer 140, the second semiconductor layer 130, and the first semiconductor layer 120, and the surface of the fourth semiconductor layer 150. Therefore, the gate insulating film F1 insulates the gate electrode G1 and the semiconductor layers.

The lower end of the body electrode B1 is about as high as the lower end of the third semiconductor layer 140. A difference between the lower end of the body electrode B1 and the lower end of the third semiconductor layer 140 is 1 nm to 100 nm.

The impurity concentration of the third semiconductor layer 140 is lower than the impurity concentration of the second semiconductor layer 130. The impurity concentration of the third semiconductor layer 140 is not more than 0.6 times the impurity concentration of the second semiconductor layer 130. In this case, the current flowing in a vertical direction is increased by about 1%. More preferably, the impurity concentration of the third semiconductor layer 140 is not more than 0.1 times the impurity concentration of the second semiconductor layer 130. When the carrier concentration is lower as in the third semiconductor layer 140, electrons are easily collected in a channel area when the device is turned on. Therefore, a current easily flows in a vertical direction in the semiconductor device 100. That is, the on-resistance of the semiconductor device 100 is lower than the on-resistance of the conventional semiconductor device.

2. Electrode Structure of Semiconductor Device

Figure 2:
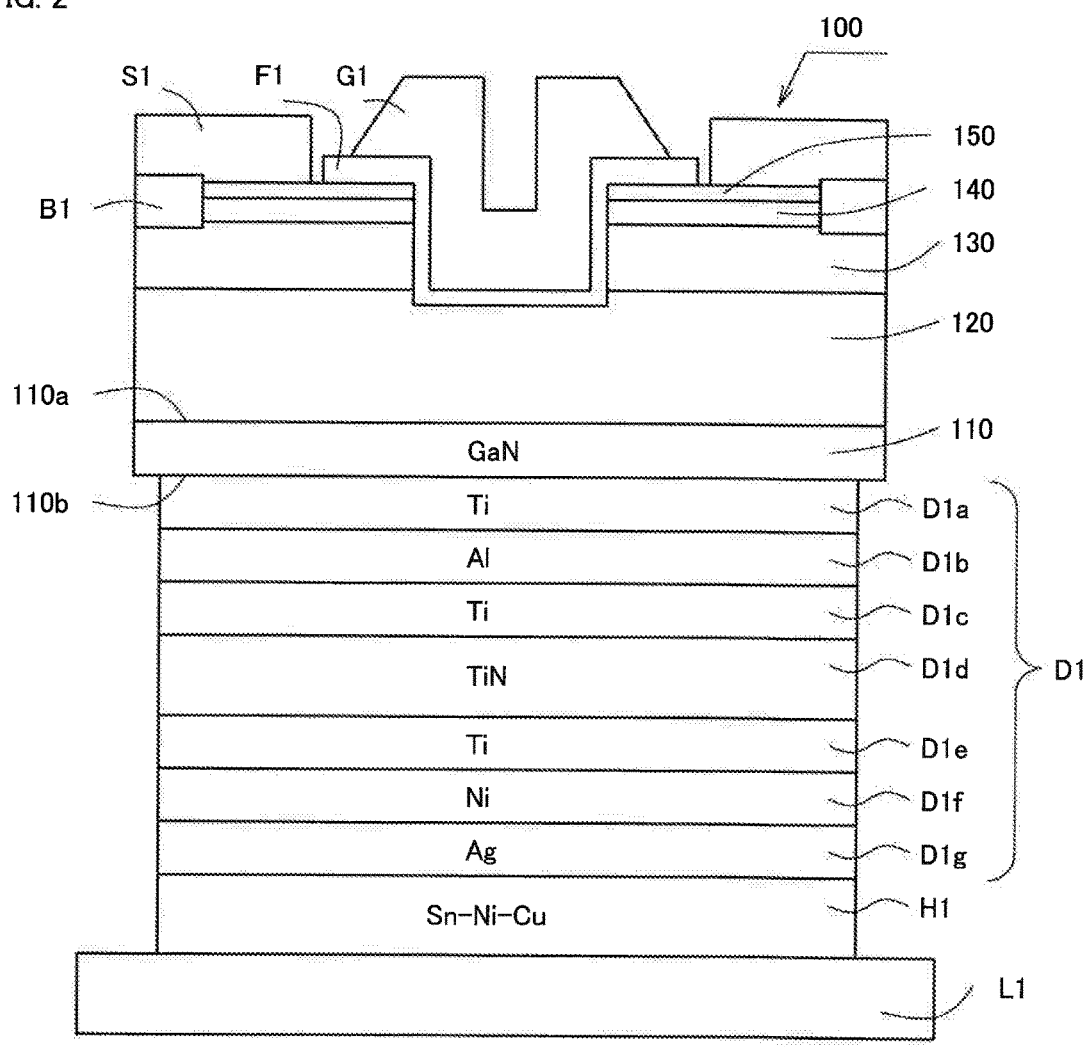
FIG. 2 shows the electrode structure of the semiconductor device of the first embodiment.

FIG. 2 shows the electrode structure of the semiconductor device 100 of the first embodiment. FIG. 2 shows the semiconductor device 100 mounted on the substrate. FIG. 2 actually shows the structure from the semiconductor device 100 to the lead frame (current supply member) L1 of the substrate (supporting substrate). In FIG. 2, for easier viewing of the electrode structure of the semiconductor device 100, the deposition structure of the drain electrode D1 is enlarged.

As shown in FIG. 2, the drain electrode D1 has a Ti layer D1a, an Al layer D1b, a Ti layer D1c, a TiN layer D1d, a Ti layer D1e, a Ni layer D1f, and an Ag layer D1g in order from the second surface 110b of the GaN substrate 110. The Ag layer D1g is bonded to the lead frame L1 via a solder layer H1. The material of the solder layer H1 is Sn—Ni—Cu based lead-free solder.

The Ti layer D1a is a first Ti layer formed on the second surface 110b of the GaN substrate 110. The Ti layer D1a is held between the GaN substrate 110 and the Al layer D1b. The Ti layer D1a is in contact with the GaN substrate 110 and the Al layer D1b. The thickness of the Ti layer D1a is, for example, 10 nm to 50 nm.

The Al layer D1b is held between the Ti layer D1a and the Ti layer D1c. The Al layer D1b is in contact with the Ti layer D1a and the Ti layer D1c. The thickness of the Al layer D1b is, for example, 100 nm to 500 nm.

The Ti layer D1c is a second Ti layer formed on the Al layer D1b. The Ti layer D1c is held between the Al layer D1b and the TiN layer D1d. The Ti layer D1c is in contact with the Al layer D1b and the TiN layer D1d. The thickness of the Ti layer D1c is, for example, 10 nm to 50 nm.

The TiN layer D1d is held between the Ti layer D1c and the Ti layer D1e. The TiN layer D1d is in contact with the Ti layer D1c and the Ti layer D1e. The thickness of the TiN layer D1d is, for example, 500 nm to 6,000 nm.

The Ti layer D1e is a third Ti layer formed on the TiN layer D1d. The Ti layer D1e is held between the TiN layer D1d and the Ni layer D1f. The Ti layer D1e is in contact with the TiN layer D1d and the Ni layer D1f. The thickness of the Ti layer D1e is, for example, 10 nm to 50 nm.

The Ni layer D1f is held between the Ti layer D1e and the Ag layer D1g. The Ni layer D1f is in contact with the Ti layer D1e and the Ag layer D1g. The thickness of the Ni layer D1f is, for example, 200 nm to 1,000 nm.

The Ag layer D1g is formed on the Ni layer D1f. The Ag layer D1g is in contact with the Ni layer D1f. The thickness of the Ag layer D1g is, for example, 500 nm to 4,000 nm. The Ag layer D1g is the outermost surface of the drain electrode D1. Therefore, the Ag layer D1g is bonded to the solder layer H1.

The Ti layer D1a and the Al layer D1b are layers for reducing the contact resistance to the GaN substrate 110. The Ti layer D1c, the TiN layer D1d, and the Ti layer D1e are layers for preventing diffusion of Ag. The Ni layer D1f is a layer for suitably bonding with solder. The Ag layer D1g is a layer for protecting the solder surface.

3. Current Flowing in Semiconductor Device

Figure 3:
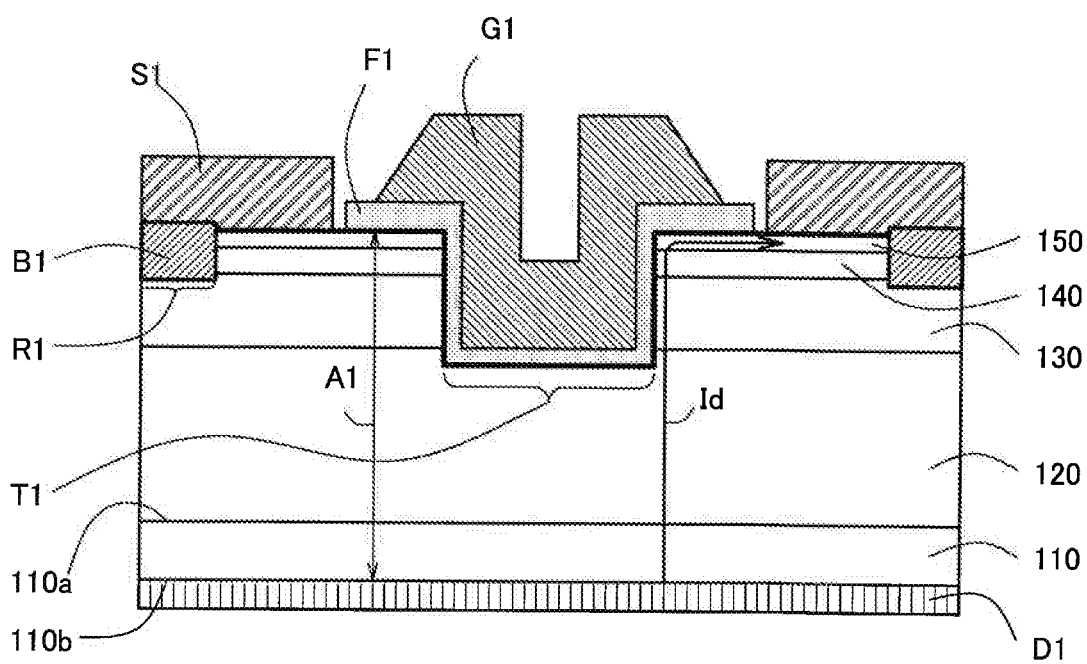
FIG. 3 shows a drain current flowing in the semiconductor device of the first embodiment.

FIG. 3 shows a drain current Id flowing in the semiconductor device 100 of the first embodiment. When the potential of the gate electrode G1 reaches a threshold voltage, a current starts to flow from the drain electrode D1 toward the source electrode S1. This is the drain current Id. As shown in FIG. 3, the drain current Id passes from the drain electrode D1 through the channel induced in the vicinity of the gate electrode G1, and flows toward the source electrode S1. Carriers flowing in the cannel are electros supplied from the forth semiconductor layer 150.

As shown with an arrow A1 in FIG. 3, the on-resistance of the semiconductor device 100 is the electric resistance of layers provided between the source electrode S1 and the drain electrode D1. That is, the electric resistance between the GaN substrate 110 and the fourth semiconductor layer 150 bears the on-resistance of the semiconductor device 100.

4. Effect of First Embodiment

In the drain electrode D1 of the semiconductor device 100, the Ti layer D1c, the TiN layer D1d, and the Ti layer D1e prevent Ag diffusion from the Ag layer D1g. Therefore, Ag of the Ag layer D1g hardly exerts an adverse effect on the GaN substrate 110.

In the drain electrode D1 of the semiconductor device 100, the Ni layer D1f is suitably bonded to the solder layer H1. Thus, the drain electrode D1 is suitably bonded to the solder layer H1. The Ni layer D1f suppresses Ag diffusion from the Ag layer D1g.

When the carrier (hole) concentration is lower as in the third semiconductor layer 140, electrons are more easily collected to the channel near the gate when the device is turned on, i.e., resistance of the channel is reduced. Therefore, a current easily flows in a vertical direction in the semiconductor device 100. That is, the on-resistance of the semiconductor device 100 is lower than the on-resistance of the conventional semiconductor device.

5. Variations

5-1. Al-Containing Layer

An Al-containing layer may be used instead of the Al layer D1b. The Al-containing layer is made of, for example, AlSi alloy. Needless to say, other alloy may be used.

5-2. Ag-Containing Layer

An Ag-containing layer may be used instead of the Ag layer D1g.

5-3. Carrier Concentration

The third semiconductor layer 140 may be doped with a first conduction type (n-type) impurity and a second conduction type (p-type) impurity. The n-type conduction impurity is, for example, Si. The p-type conduction impurity is, for example, Mg. However, the concentration of the second conduction type impurity in the third semiconductor layer 140 is higher than the concentration of the first conduction type impurity in the third semiconductor layer 140.

In this case, the effective carrier (hole) concentration of the third semiconductor layer 140 is lower than the hole concentration generated by only the second conductive type impurity concentration. The carrier (hole) concentration of the third semiconductor layer 140 may be lower than the carrier (hole) concentration of the second semiconductor layer 130. The carrier (hole) concentration of the third semiconductor layer 140 is not more than 0.6 times the carrier (hole) concentration of the second semiconductor layer 130.

5-4. Other Variation

The channel may be p-channel whose conduction carriers are holes. Also the MOSFET may be normally on type, i.e., depression mode type.

5-5. Combinations

The aforementioned variations may be combined with one another without any restriction.

Second Embodiment

Next will be described the second embodiment. The difference between the first embodiment and the second embodiment is the GaN substrate. Therefore, only the difference will be described.

1. Semiconductor Device

Figure 4:
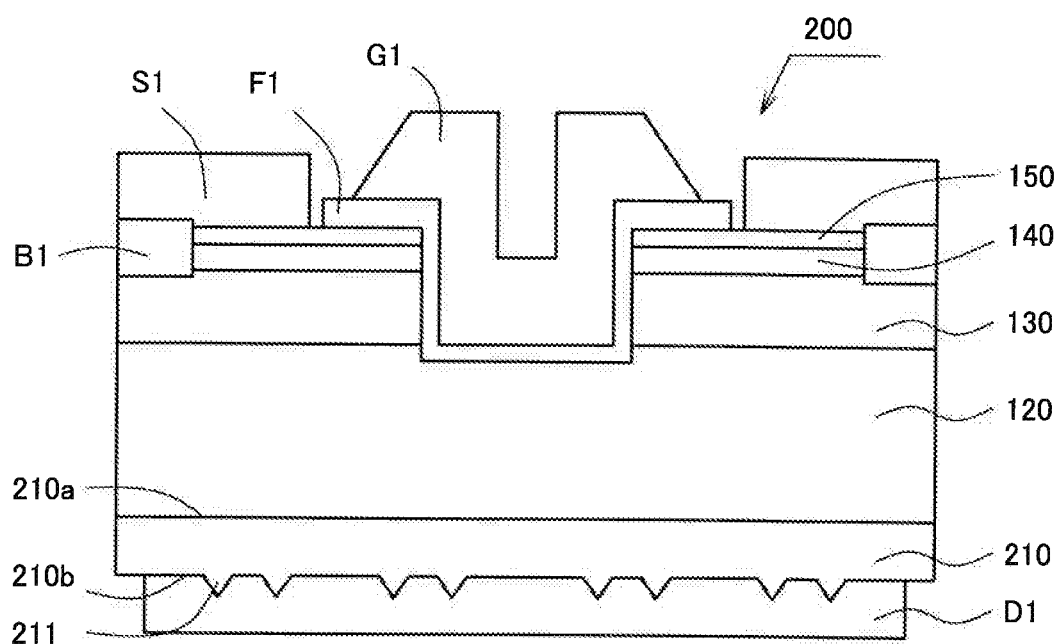
FIG. 4 is a schematic view of the structure of a semiconductor device of a second embodiment.

FIG. 4 is a schematic view of the structure of a semiconductor device 200 of a second embodiment. The semiconductor device 200 is a vertical MOSFET. As shown in FIG. 4, the semiconductor device 200 includes a GaN substrate 210, a first semiconductor layer 120, a second semiconductor layer 130, a third semiconductor layer 140, a fourth semiconductor layer 150, a body electrode B1, a drain electrode D1, a source electrode S1, a gate electrode G1, and a gate insulating film F1.

The GaN substrate 210 is an n-type GaN substrate. The GaN substrate 210 has a first surface 210a and a second surface 210b. The first surface 210a and the second surface 210b are positioned opposite to each other. The first surface 210a is a surface for forming a semiconductor layer. The second surface 210b is a surface for forming a drain electrode D1. For example, the first surface 110a is a +c plane, and the second surface 110b is a −c plane.

2. Concave-Convex Shape of GaN Substrate

The GaN substrate 210 has a plurality of convex parts 211 on the second surface 210b. The convex parts 211 are randomly formed over the second surface 210b. The convex part 211 has a conical shape or a shape close to a conical shape. The height of the convex part 211 is, for example, 1,000 nm to 2,000 nm. The bottom width of the convex part 211 is, for example, 500 nm to 1,000 nm. Needless to say, any numerical range other than the above may be used. The second surface 210b has a −c plane and the convex parts 211.

3. Production Method for Semiconductor Device

3-1. Forming Concave-Convex Shape

A concave-convex shape is formed on the back surface of the GaN substrate by wet etching the GaN substrate with TMAH. During this process, the temperature of TMAH is, for example, 40° C. to 90° C. The wet etching time is, for example, 2 minutes to 10 minutes.

3-2. Forming Semiconductor Layer

A first semiconductor layer 120, a second semiconductor layer 130, a third semiconductor layer 140, and a fourth semiconductor layer 150 are grown on the first surface 210a of the GaN substrate 210, for example, through MOCVD.

3-3. Forming Recessed Part

Subsequently, a recess R1 and a trench T1 are formed by ICP (Inductively Coupled Plasma) dry etching.

3-4. Forming Electrode

A gate insulating film F1 is formed. After that, a gate electrode G1, a body electrode B1, a source electrode S1, and a drain electrode D1 are formed by sputtering, EB (Electron Beam) deposition method or resistance heating deposition method.

3-5. Annealing

Annealing is performed. The annealing temperature is, for example, 350° C. to 600° C. The annealing time is, for example, 15 minutes to one hour. These are only examples, and any annealing conditions other than the above may be used. Thus, an ohmic contact is formed between the semiconductor and the electrode.

3-6. Other Processes

Other processes such as forming protective film may be performed.

4. Effect of Second Embodiment

Since the second surface 210b of the GaN substrate 210 has a plurality of convex parts 211, the drain electrode D1 is suitably in contact with the GaN substrate 210. That is, the contact resistance between the drain electrode D1 and the GaN substrate 210 is lower than that in the first embodiment.

Annealing may be performed only one time to form an Ohmic contact.

If the process for forming concave-convex shape is not performed, the semiconductor device 100 of the first embodiment can be produced.

5. Variations

5-1. Shape of Convex Part

The convex part 211 has a conical shape. However, the convex part may have a hexagonal pyramid shape or other polygonal pyramid shape. The convex part may be a concave part. Thus, the second surface 210b of the GaN substrate 210 may have a concave-convex shape.

5-2. Others

Variations of the first embodiment may be used.

Experiment

1. Experiment 1 (Effect on GaN Substrate

1-1. Production of Samples

Five types of samples having electrode structures of structure 1 to structure 5 shown in Table 1 were produced. The values in Table 1 indicate the thickness (nm) of each layer. A sapphire substrate was used to observe the electrode. In Table 1, a sapphire substrate is indicated as "Sap". In structure 1 to structure 4, Ti, AlSi, Ti, TiN, Ti, Ni, and Ag were sequentially formed from the sapphire substrate side. In structure 5, Ti, AlSi, Ni, and Ag were sequentially formed from the sapphire substrate side.

Five types of samples were annealed in a nitrogen atmosphere at 450° C. for 30 minutes. Annealing was repeated twice.

1-2. Check of Discoloration

As shown in Table 1, whether the samples having electrode structures of structure 1 to structure 5 were discolored or not was visually checked from the sapphire substrate side. As shown in Table 1, in structure 1 and structure 2, discoloration was not observed. In structure 3 to structure 5, discoloration was observed. When discoloration was observed, Ag of the electrode is considered to move to the surface of the sapphire substrate. Therefore, when the TiN layer has a thickness of 1,000 nm or 5,000 nm as in structure 1 and structure 2, there is no risk of giving damage to the GaN substrate. That is, the thickness of the TiN layer is preferably 500 nm to 6,000 nm. The thickness of the TiN layer is more preferably 1,000 nm to 5,000 nm.

TABLE 1

| thickness (nm) | Structure 1 | Structure 2 | Structure 3 | Structure 4 | Structure 5 |
|---|---|---|---|---|---|
| Substrate | Sap | Sap | Sap | Sap | Sap |
| Ti | 30 | 30 | 30 | 30 | 30 |
| AlSi | 300 | 300 | 300 | 300 | 300 |
| Ti | 20 | 20 | 20 | 20 | — |
| TiN | 5,000 | 1,000 | 200 | 50 | — |
| Ti | 20 | 20 | 20 | 20 | — |
| Ni | 500 | 500 | 500 | 500 | 500 |
| Ag | 2,000 | 2,000 | 2,000 | 2,000 | 2,000 |
| Discoloring | No | No | Yes | Yes | Yes |

1-3. Analysis of Cross Section (GaN Substrate

The above result was confirmed using the GaN substrate. Ti, AlSi, Ti, TiN, Ti, and Ag were sequentially deposited from the GaN substrate. When Ni does not exist and Ag is colored in the cross sectional view, a colored part was observed on the surface of the GaN substrate. In this way, it was confirmed that Ag moved to the surface of the GaN substrate. The Ni layer prevents Ag from diffusing.

2. Experiment 2 (Adhesion Strength

2-1. Production of Samples

Three types of samples having electrode structures of structure 6 to structure 8 shown in Table 2 were produced. The values in Table 2 indicate the thickness (nm) and the strength (MPa) of each layer. The electrode structure of structure 6 in Table 2 is the same as the electrode structure of structure 2 in Table 1. However, these structures were solder bonded to the metal plate (frame) using Sn—Ni—Cu based lead-free solder.

Three types of samples were annealed in a nitrogen atmosphere at 450° C. for 30 minutes. Annealing was repeated twice.

In these samples, a concave-convex shape was formed on the back surface of the GaN substrate with TMAH. Etching process was performed at 60° C. for 5 minutes.

2-2. Measurement Results of Adhesion Strength

The die shear strength was measured for three types of samples in Table 2. As shown in Table 2, the strength of structure 6 was 33.9 MPa. The strength of structure 7 was 33.4 MPa. The strength of structure 8 was 7.2 MPa to 8.0 MPa. In structure 8, the electrode was easily peeled. Therefore, the Ni layer is required to suitably bond the electrode and the solder.

TABLE 2

| thickness (nm) | Structure 6 | Structure 7 | Structure 8 |
|---|---|---|---|
| Substrate | GaN | GaN | GaN |
| Ti | 30 | 30 | 30 |
| AlSi | 300 | 300 | 300 |
| Ti | 20 | 20 | 10 |
| TiN | 1,000 | — | 1,000 |
| Ti | 20 | — | 10 |
| Ni | 500 | 500 | — |
| Ag | 2,000 | 2,000 | 5,000 |
| Soldering | Yes | Yes | Yes |
| Metal plate | Yes | Yes | Yes |
| Intensity | 33.9 MPa | 33.4 MPa | 7.2 to 8.0 MPa |

3. Experiment 3 (Increase of Electric Resistance in a High Temperature Environment

3-1. Production of Samples

Figure 5:
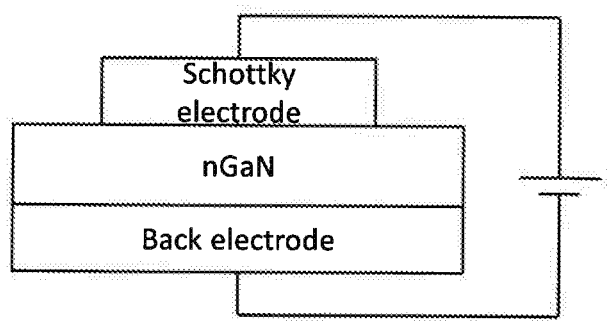
FIG. 5 shows the structure of an experimental sample.

Samples having a structure shown in FIG. 5 were produced. That is, electrodes shown in Table 2 were formed on a −c plane of the n-type GaN substrate, Schottky electrodes were formed on a +c plane of the GaN substrate. The electrode structures were the same as three types of structure 6 to structure 8 in Table 2. Three types of samples were annealed in a nitrogen atmosphere at 450° C. for 30 minutes. The Schottky electrode was formed by forming a Ni layer having a thickness of 200 nm, and a Mo layer having a thickness of 20 nm on the Ni layer from GaN side.

In these samples, a concave-convex shape was formed on the back surface of the GaN substrate with TMAH. Etching process was performed at 60° C. for 5 minutes.

3-2. Experiment Method

After that, the samples were left under a temperature environment of 300° C., and a change in electric resistance was measured.

3-3. Experimental Results

Figure 6:
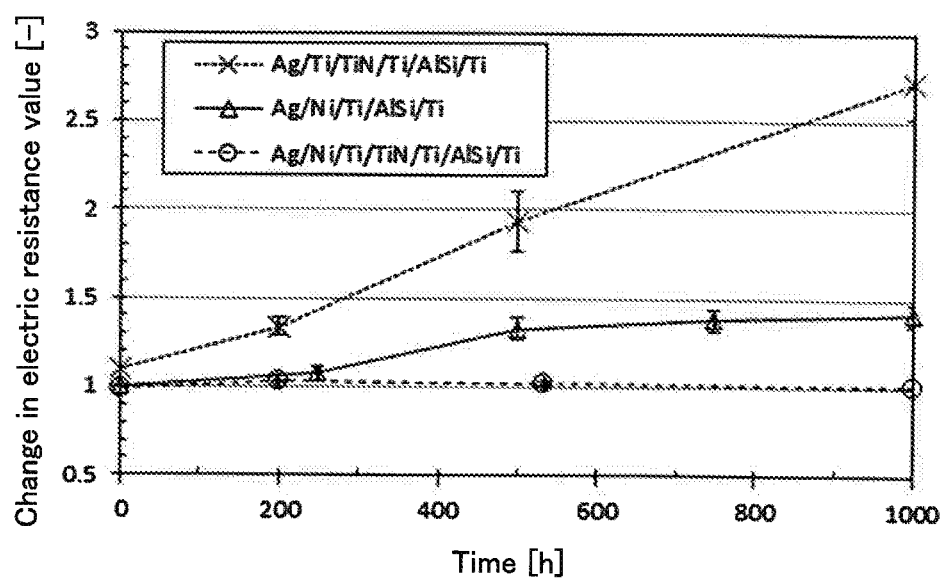
FIG. 6 is a graph showing the relationship between time for which experimental samples are left under a temperature environment of 300° C. and electric resistance.

FIG. 6 is a graph showing the relationship between time for which experimental samples are left under a temperature environment of 300° C. and electric resistance. The horizontal axis of FIG. 6 indicates time for which samples are left under a temperature environment of 300° C. The vertical axis of FIG. 6 indicates electric resistance of samples. Here, the electric resistance value for 0 hours in the sample having structure 6 was normalized as 1.

As shown in FIG. 6, in structure 6, even if the sample was left under a high temperature condition, the electric resistance was hardly increased. In structure 7, the electric resistance increased with time by leaving the sample under a high temperature condition. After 1,000 hours, the electric resistance value in structure 7 was increased by about 1.4 times the electric resistance value of structure 6. In structure 8, the electric resistance increased with time by leaving the sample under a high temperature condition. After 1,000 hours, the electric resistance value in structure 8 was increased by about 2.7 times the electric resistance value in structure 6.

4. Summary of Experiments

A suitable back electrode was formed on the GaN substrate by forming an electrode structure of the first embodiment on the back surface of the GaN substrate. That is, the electrode structure is sufficiently bonded with solder without exerting an adverse effect on the GaN substrate, thereby suppressing an increase in electric resistance under a high temperature condition.

What is claimed is:

1. A semiconductor device comprising:
   a GaN base layer having a first surface and a second surface;
   a Group III nitride semiconductor layer on the first surface of the GaN base layer; and
   an electrode on the second surface of the GaN base layer, wherein
   the first surface is a +c plane;
   the second surface is a surface opposite to the first surface; and
   the electrode has a first Ti layer, an Al-containing layer, a second Ti layer, a TiN layer, a third Ti layer, a Ni layer, and an Ag-containing layer sequentially from the second surface.

2. The semiconductor device according to claim 1, wherein the thickness of the TiN layer is 500 nm to 6,000 nm.

3. The semiconductor device according to claim 1, wherein the thickness of the TiN layer is 1,000 nm to 5,000 nm.

4. The semiconductor device according to claim 1, the semiconductor device comprising:
   a supporting substrate for supporting the semiconductor device; and
   a current supply member disposed on the supporting substrate, for supplying a current to the semiconductor device, wherein
   the Ag-containing layer is connected with the current supply member by a lead-free solder.

5. The semiconductor device according to claim 4, wherein the lead-free solder is a Sn—Ni—Cu based solder.

6. The semiconductor device according to claim 1, wherein the second surface of the GaN base layer has a concave-convex shape.

7. The semiconductor device according to claim 2, wherein the Al-containing layer is an AlSi layer.

8. The semiconductor device according to claim 7, wherein the thickness of the first Ti layer is 10 nm to 50 nm, the thickness of the AlSi layer is 100 nm to 500 nm, the thickness of the second Ti layer is 10 nm to 50 nm, the thickness of the third Ti layer is 10 nm to 50 nm, the thickness of the Ni layer is 200 nm to 1,000 nm, and the thickness of the Ag-containing layer is 500 nm to 4,000 nm.

9. The semiconductor device according to claim 4, wherein the Al-containing layer is an AlSi layer.

10. The semiconductor device according to claim 4, wherein the semiconductor device is a trench gate vertical field effect transistor and the electrode is a drain electrode.

11. The semiconductor device according to claim 8, wherein the semiconductor device is a trench gate vertical field effect transistor and the electrode is a drain electrode.

12. The semiconductor device according to claim 11, wherein the trench gate vertical field effect transistor comprising:
    an n-type GaN substrate as the GaN base layer;
    an n$^-$-type GaN layer formed on the n-type GaN substrate, electron concentration of the n$^-$-type GaN layer being smaller than electron concentration of the n-type GaN substrate;
    a p-type GaN layer formed on the n$^-$-type GaN layer;
    a p$^-$-type GaN layer formed on the p-type GaN layer, hole concentration of the p$^-$-type GaN layer being smaller than hole concentration of the p-type GaN layer;
    an n$^+$-type GaN layer formed on the p$^-$-type GaN layer;
    a trench penetrated from the n$^+$-type GaN layer to an upper part of the n$^-$-type GaN layer;
    an isolation film covering an inner surface of the trench;
    a gate electrode formed on the isolation film;
    a source electrode contacted with the n$^-$-type GaN layer; and
    a body electrode contacted with at least one of the p-type GaN layer and the p$^-$-type GaN layer.

13. The semiconductor device according to claim 12, the semiconductor device comprising:
    a supporting substrate for supporting the semiconductor device; and
    a current supply member disposed on the supporting substrate, for supplying a current to the semiconductor device, wherein
    the Ag-containing layer is connected with the current supply member by a lead-free solder.

* * * * *